United States Patent
Ser et al.

(10) Patent No.: US 7,370,505 B2
(45) Date of Patent: May 13, 2008

(54) METHOD OF FORMING BLIND HOLES IN A SHEET OF MATERIAL

(75) Inventors: Song Cheh Ser, Singapore (SG); Weng How Leong, Singapore (SG)

(73) Assignee: Metalform Asia PTE Ltd., Singapore (SG)

( * ) Notice: Subject to any disclaimer, the term of this patent is extended or adjusted under 35 U.S.C. 154(b) by 111 days.

(21) Appl. No.: 11/289,638

(22) Filed: Nov. 30, 2005

(65) Prior Publication Data

US 2006/0117928 A1 Jun. 8, 2006

(30) Foreign Application Priority Data

Dec. 1, 2004 (SG) .............................. 200407251-8

(51) Int. Cl.
B21D 28/26 (2006.01)
B21D 31/00 (2006.01)

(52) U.S. Cl. ........................... 72/335; 72/326; 72/379.2

(58) Field of Classification Search ................... 72/334, 72/335, 326, 379.2; 29/890.142, 890.143, 29/896.6

See application file for complete search history.

(56) References Cited

U.S. PATENT DOCUMENTS

| | | | |
|---|---|---|---|
| 866,021 A | 9/1907 | Hansen | |
| 1,124,359 A | 1/1915 | Taylor | |
| 1,652,208 A * | 12/1927 | McEvoy, Jr. | ................. 72/324 |
| 3,141,358 A * | 7/1964 | Burke, Jr. et al. | ............ 72/341 |
| 3,387,481 A | 6/1968 | Harvey et al. | |
| 3,490,121 A * | 1/1970 | Biehl et al. | .............. 29/890.01 |
| 3,731,369 A | 5/1973 | Johnson | |
| 4,177,665 A | 12/1979 | Schurmann | |
| 6,018,976 A * | 2/2000 | Wolf | ........................... 72/327 |
| 6,176,266 B1 * | 1/2001 | Huber et al. | ................. 137/800 |
| 6,408,669 B1 * | 6/2002 | Meeker et al. | ................. 72/325 |
| 7,013,696 B2 | 3/2006 | Ando | |

OTHER PUBLICATIONS

Related U.S. Appl. No. 11/289,648, filed Nov. 30, 2005; Inventors; Ser et al.
Office action issued in U.S Appl. No. 11/289,648, dated May 21, 2007.
Office action issued in U.S Appl. No. 11/289,648, dated Jul. 12, 2007.

* cited by examiner

*Primary Examiner*—Daniel C Crane
(74) *Attorney, Agent, or Firm*—Nixon & Vanderhye P.C.

(57) ABSTRACT

A method of forming blind holes in a sheet material is provided. The method includes punching the sheet material to define a hollow projection through the material and shearing a layer of material from the sheet material to form a sealed end over an opening of the hollow projection to form the blind hole. Further processing of the sheet material may be required depending on the desired diameter of the blind hole. Such further processing includes enlarging the hollow projection to a desired diameter of the blind hole and shearing the layer of material with several tapered pins with progressively decreasing diameters. As the scaled end formed is likely to have an uneven surface, the sealed end may be flattened to render a more refined appearance.

7 Claims, 6 Drawing Sheets

FIG. 3B
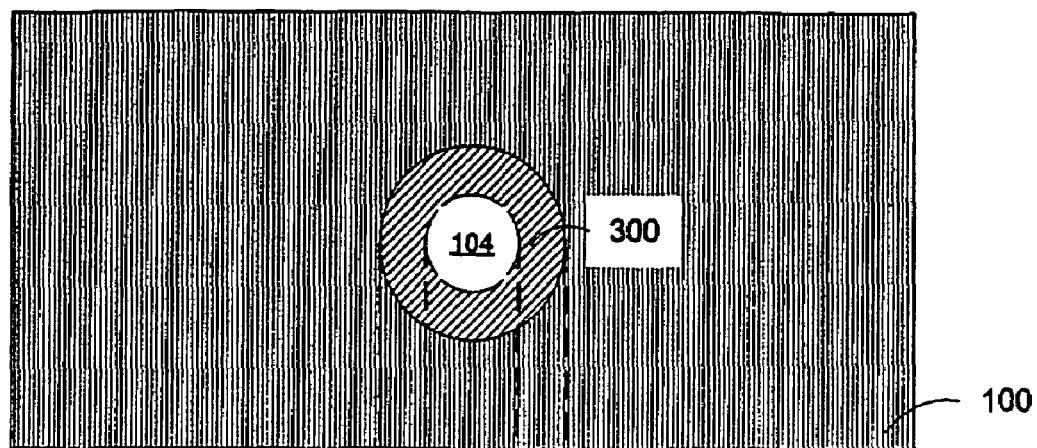
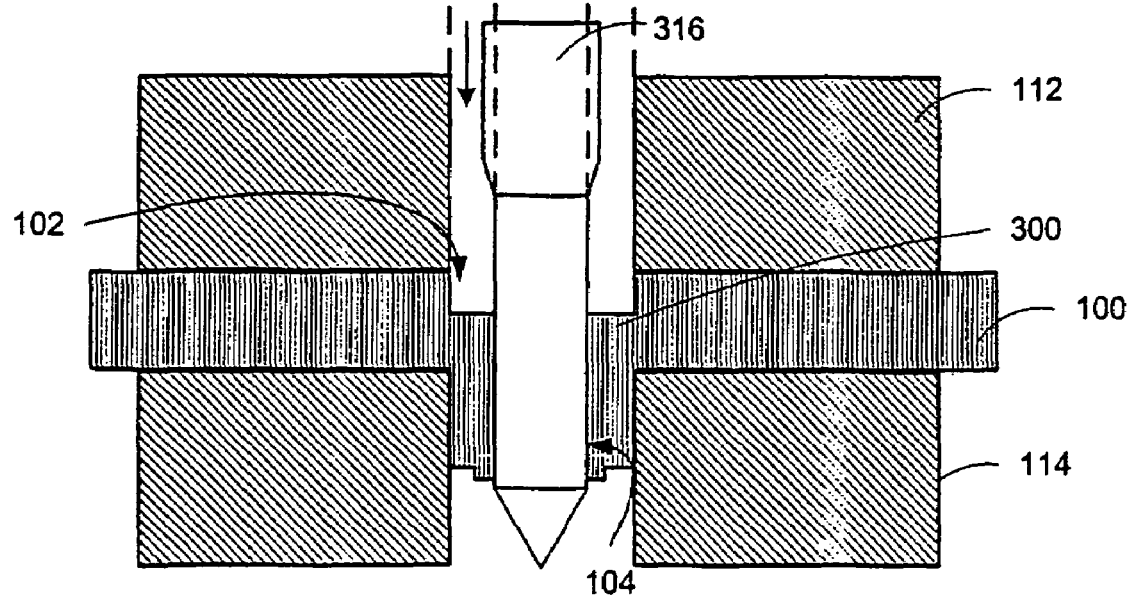
FIG. 3A

METHOD OF FORMING BLIND HOLES IN A SHEET OF MATERIAL

BACKGROUND

1. Field of the Invention

The present disclosure relates to a method for processing a sheet of material. More particularly, it relates to a method of forming blind holes in a sheet of material.

2. Description of the Related Art

A blind hole is a hollow projection opened at one end and closed at the opposite end. Blind holes have wide applications ranging from locking mechanisms to electronic devices. They are useful in situations where through holes would render a less refined appearance than desired.

Blind holes are also useful in applications requiring air-tightness, such as in hard disk drives where airflow may contaminate the interior of the hard drive. In such applications, blind holes may be formed in the casing for mounting printed circuit boards (PCB), motors, and semiconductor chips.

A conventional method of forming a blind hole begins by drilling a through hole in sheet material. One end of the through hole is then closed by placing a seal over that end. One problem arising from this method is that the depth of the hole is limited to the thickness of the sheet material. Using a thicker sheet of material will enable the construction of a deeper blind hole.

However, in portable devices, where weight and form factor are crucial, having a thick sheet of material is not practical. Another problem arises with the use of seals to close the through hole. The typical seals or plugs may not provide an air-tight seal, and hence the seal would not be an adequate seal for a blind hole of a hard disk drive casing.

Another method of forming a blind hole is by controlling the depth of drilling into a sheet material. Unfortunately, one of the problems arising from this method is that the depth of the hole is limited to the thickness of the sheet material. Further, drilled material bits may be trapped in the blind hole and requiring additional effort to remove. Removing the debris from the blind hole is usually accomplished by using compressed air, which may lodge fling debris on other parts of the sheet material.

Another conventional method of forming a blind hole begins by compressing the sheet material against a die having an orifice therein A portion of the sheet material is then extruded into the orifice by the compression to form an extruded portion by employing a ram press. A post is then forcibly inserted into the extruded portion of the sheet material so that the extruded portion forms a hollow projection around the post. The insertion of the post is controlled so that a through hole will not be formed. When the post is finally withdrawn, a blind hole or hollow projection having a closed end at the sheet material is formed. One problem with this compression method is that a recess or indentation may be formed at the side of the compressed sheet when the sheet material is forcibly extruded into the orifice. This deformation may be a thinned and weakened spot in the closed end of the blind hole. Another problem is that the sheet material experiences stretching and stress from the compression, which may weaken the sheet material or even cause failure.

In view of the foregoing, it is therefore desirable to provide an improved method of forming blind holes in a sheet material.

SUMMARY OF THE INVENTION

A method of forming a blind hole in a sheet material and a configuration of sheet material having a blind hole formed from this method are provided. The method includes punching the sheet material to define a hollow projection and shearing a layer of material from the sheet material to form a sealed end over an opening of the hollow projection to form the blind hole.

The method may also include enlarging the hollow projection to a predetermined desired diameter of the blind hole. An advantage of first forming a hollow projection and thereafter enlarging the diameter of the hollow projection to a desired diameter is to prevent excessive stretching and chipping of the sheet material.

Shearing a layer of material from the sheet material to form a sealed end over an opening of the hollow projection to form the blind hole includes the use of one or more tapered pins having progressively decreasing diameters to shear the sheet material and shift a mass of the sheared material towards a center of the opening of the hollow projection until a continuous layer seals the opening. To render a more refined appearance, the continuous layer or sealed end may be flattened by punching a flat pin over the sealed end.

A sheet material, formed according to the present method, includes a segment having a top surface and a bottom surface, and a blind hole segment coupled to the sheet material segment, wherein the blind hole segment includes a sidewall and a sealed end for defining the blind hole and wherein the sealed end is airtight.

The present method of forming blind holes is particularly advantageous as the closed end of the blind hole is rendered air-tight. Further, the maximum depth of the blind hole is no longer constrained by the thickness of the sheet material. Instead, the method allows the depth of the blind hole to be greater than the thickness of the sheet material if required by a user. Hence, cost and weight of materials can be reduced. With a deeper blind hole, screw threads can be made longer, resulting in a more secured fastening of the PCB, motor or other elements to a base plate made from the sheet material. This is especially desirable in portable devices, where form factor and secured fastening are of paramount importance.

BRIEF DESCRIPTION OF THE DRAWINGS

The present disclosure will be readily understood by the following detailed description in conjunction with the accompanying drawing. To facilitate this description, like reference numerals designate like structural elements.

FIG. 3A is a partial cross sectional view showing an enlarging pin driven through to the hollow projection.

FIG. 3B is a top view of the sheet material of FIG. 3A.

DETAILED DESCRIPTION

A method of processing a sheet material to form blind holes is provided. In the following description, numerous specific details are set forth in order to provide a thorough understanding of the present disclosure. It will be understood, however, to one skilled in the art, that the present disclosure may be practiced without some or all of these specific details In other instances, well known process operations have not been described in detail in order not to unnecessarily obscure the present disclosure.

Figure 1:
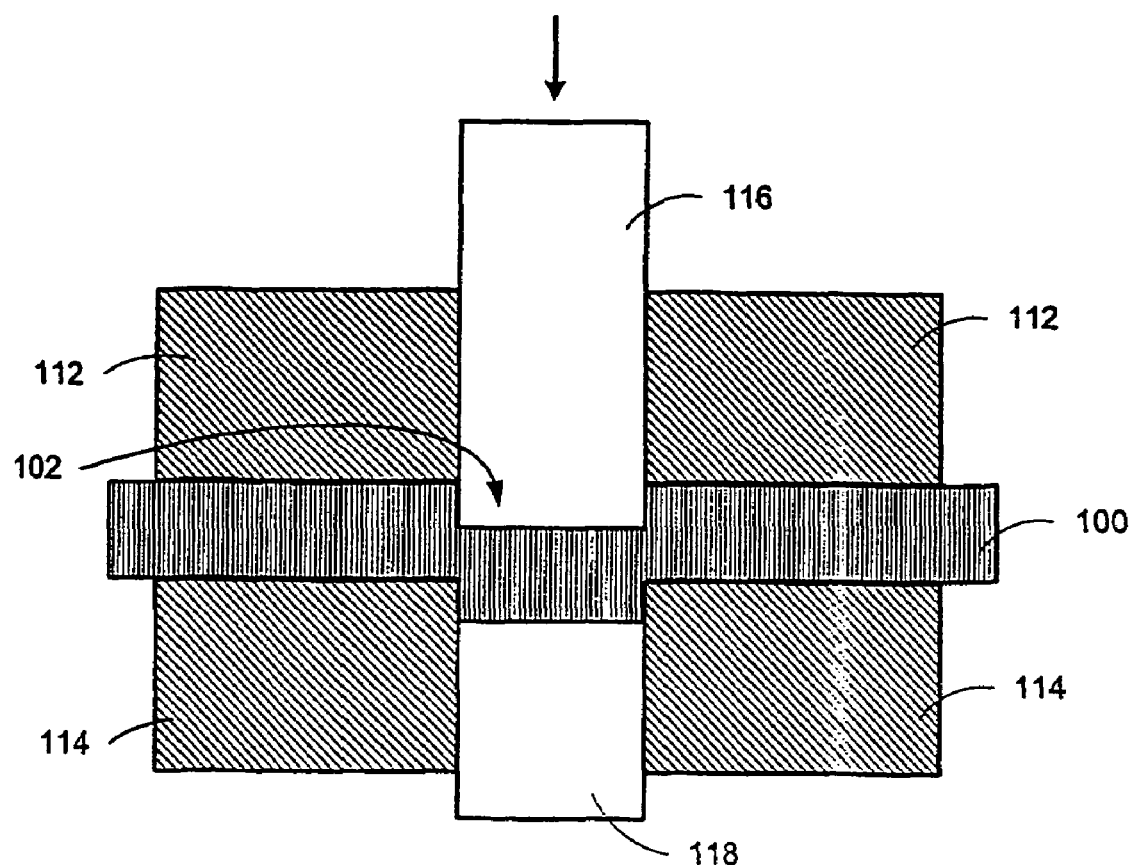
FIG. 1 is a partial cross sectional view showing a flat pin punching against a sheet material to form a recessed segment in the sheet material.

FIG. 1 illustrates a process of forming a recessed segment 102 in a sheet material 100. The sheet material 100 is secured between an upper die 112 and a lower die 114. A support pin 118 is placed under the sheet material 100 to receive the recessed segment 102 and to define the depth of the recessed segment. A flat pin 116 is used to punch the sheet material 100 from its top surface against the first support pin 118 to form the recessed segment 102 on the sheet material 100. An advantage of the recessed segment is that the resulting blind hole has an increased projection extending from the bottom surface of the sheet material 100.

Figure 2:
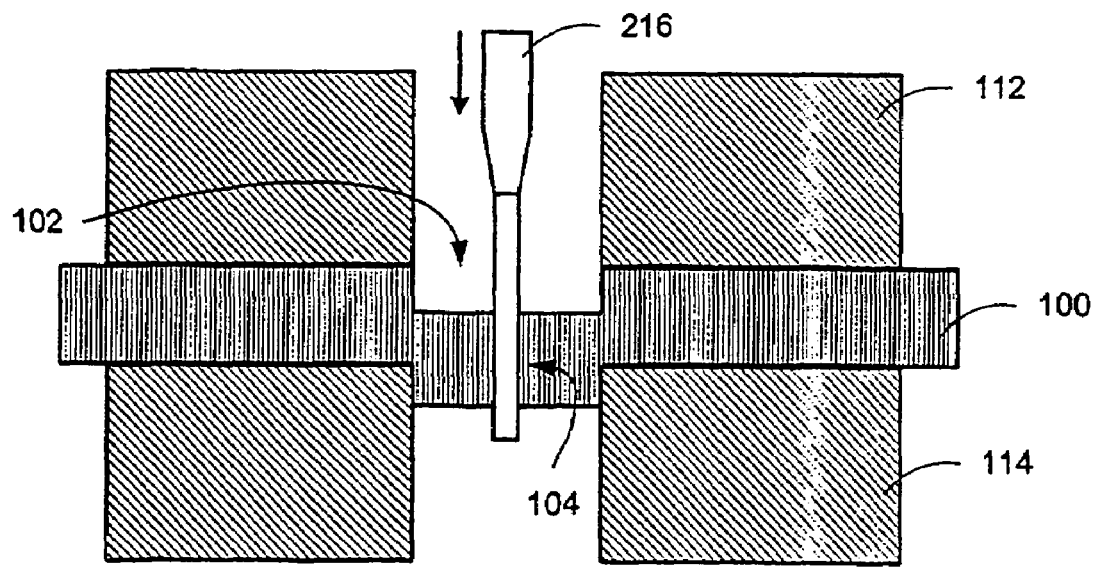
FIG. 2 is a partial cross sectional view showing a narrow pin driven through the sheet material to form a hollow projection.

FIG. 2 illustrates a process of forming a hollow projection 104 by driving or punching a narrow pin 216 through the recessed segment 102 from the top surface of the sheet material 100. The narrow pin 216 has a smaller diameter than that of the flat pin 116. Using a narrow pin to form a through hole prevents excessive stretching and chipping of the sheet material 100 when the narrow pin 216 is driven through the sheet material 100. The hollow projection 104 is defined by a top opening formed at one end in the recessed segment 102, a bottom opening at the opposite end, and a sidewall therebetween defining the depth of the hollow projection 104.

Figure 8:
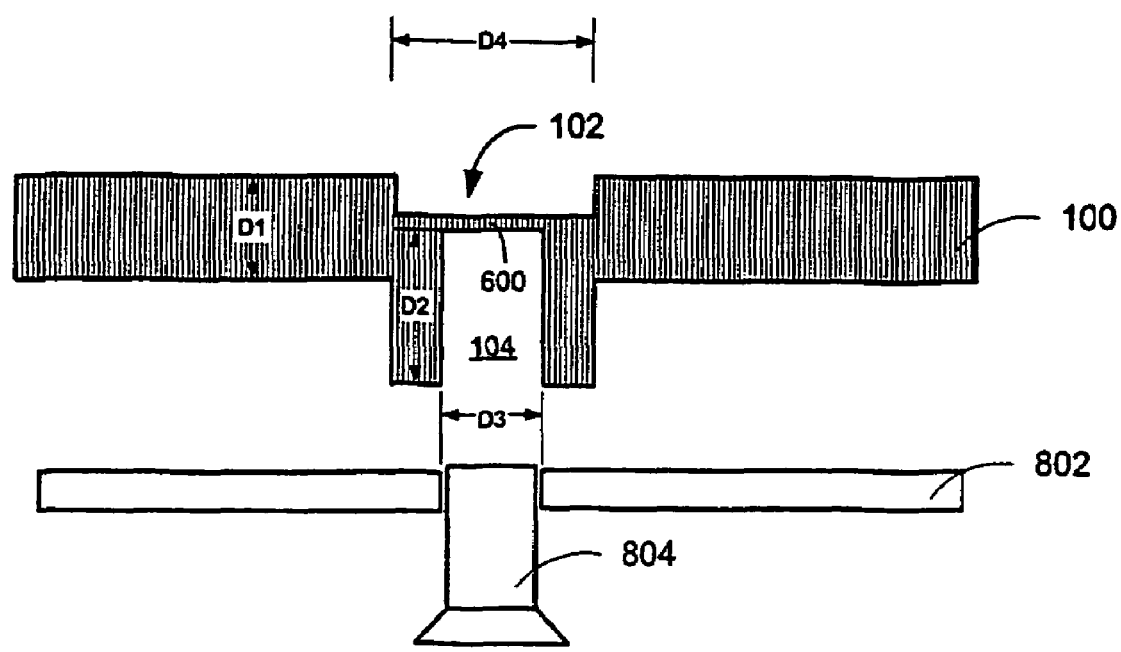
FIG. 8 shows a cross-sectional view of a blind hole formed in a sheet material.

Depending on the requirements of sheet material 100, the hollow projection 104 at this stage may not have the desired internal diameter D3 (as shown in FIG. 8) and may require enlarging. FIG. 3A illustrates a process of enlarging the hollow projection 104 to a desired internal diameter of the resulting blind hole. An enlarging pin 316, of the desired diameter, is inserted through the hollow projection 104. While the enlarging pin 316 is driven or punched through the hollow projection 104, the enlarging pin 316 forces the sheet material 100 radially from the shaft of the enlarging pin 316. Since the sheet material 100 is secured by the upper 112 and lower 114 dies, the material is forcibly extruded at the bottom opening of the hollow projection 104, thereby increasing the depth of the hollow projection (shown in FIG. 3A).

FIG. 3B shows a top view of the sheet material 100 of FIG. 3A having a layer of material 300, adjacent to the top opening of the hollow projection 104, which will be shifted towards the center of the top opening of the hollow projection 104 to form a continuous layer 600 (shown in FIG. 6) to seal the top opening.

Figure 4:
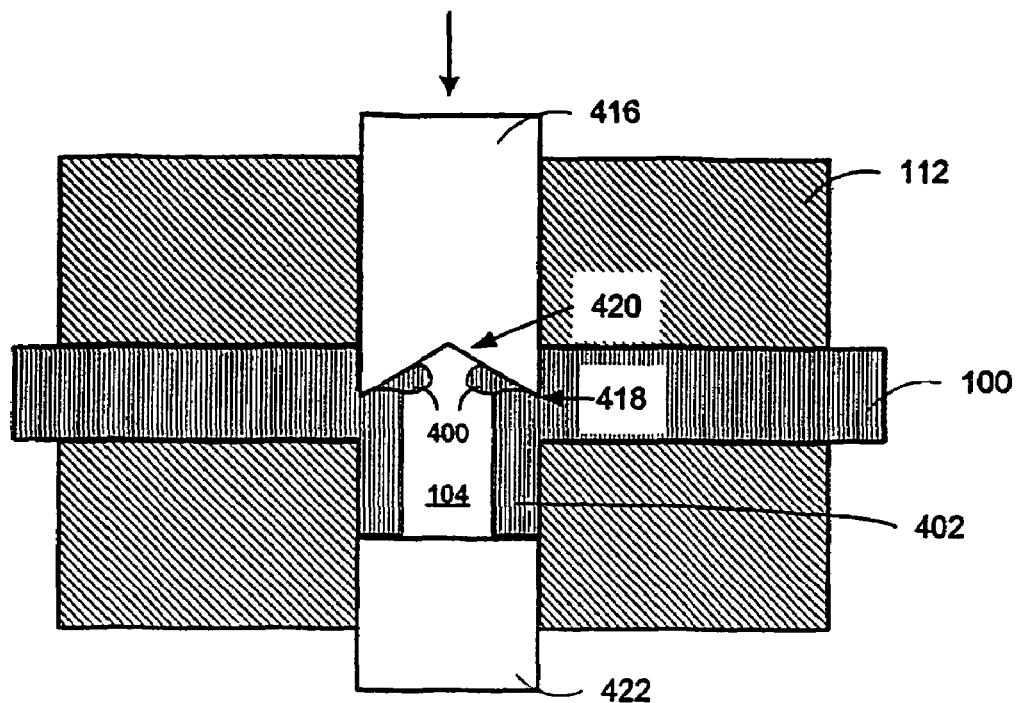
FIG. 4 is a partial cross sectional view showing a first tapered pin shearing material towards the center of the top opening of the hollow projection.

FIG. 4 illustrates a process to begin sealing the top opening of the hollow projection 104 by using a first tapered pin 416 to shear material towards the center of the top opening. The first tapered pin 416 includes a cutting edge 418 for shearing the sheet material and a tapered internal wall 420 to shift a mass of sheared material 400 to flow towards the center of the top opening of the hollow projection 104. A lower support pin 422 may be inserted between the lower dies 114 to prevent sidewalls 402 of the hollow projection 104 from undue deformation or displacement, and to flatten the sheet material 100 adjacent the bottom opening of the hollow projection 104. Depending on the desired internal diameter D3 of the hollow projection 104, further shearing may be required to form a continuous layer 600 over the top opening.

Figure 5:
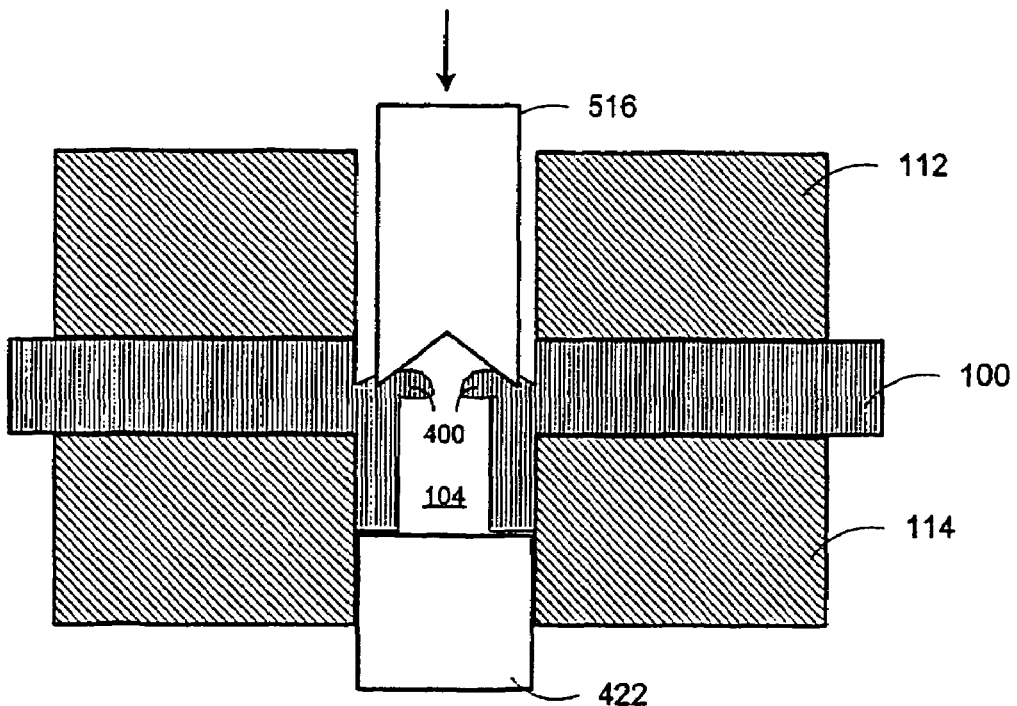
FIG. 5 is a partial cross sectional view showing a second tapered pin shearing material towards the center of the top opening of the hollow projection.
Figure 6:
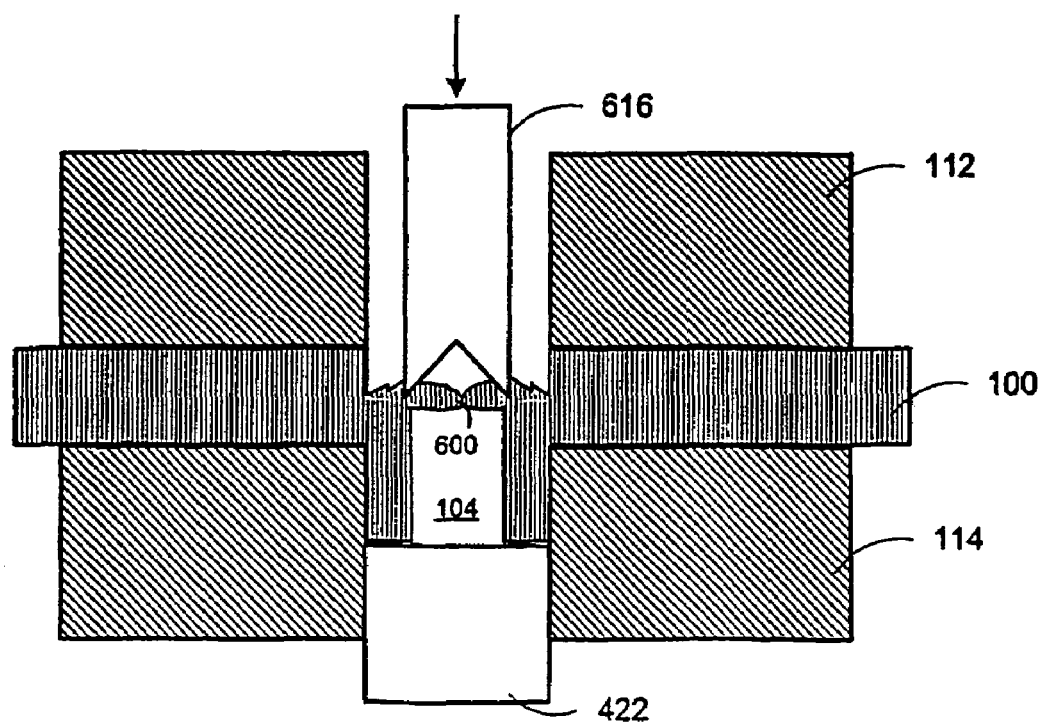
FIG. 6 is a partial cross sectional view showing a third tapered pin shearing material towards the center of the top opening of the hollow projection, and forming a continuous layer over the top opening of the hollow projection.

FIGS. 5 and 6 illustrate a process to continue sealing the top opening of the hollow projection 104 using additional tapered pins having progressively decreasing diameters. One or more narrower tapered pins may be required to apply additional force to shift sheared material 400 towards the center of the top opening. In FIG. 5, a second tapered pin 516 having a smaller diameter than the first tapered pin 416 is used and in FIG. 6, a third tapered pin 616 with an even smaller diameter is used.

Figure 7:
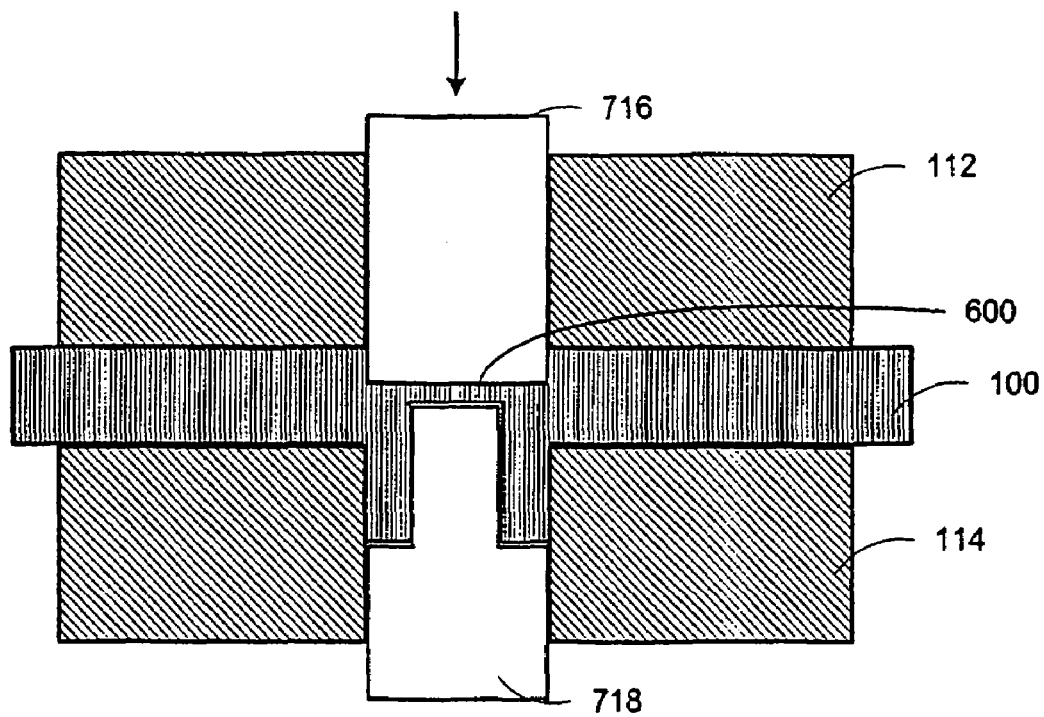
FIG. 7 is a partial cross sectional view showing a flat pin punching the continuous layer over the top opening of the hollow projection.

After the first tapered pin 416 and additional tapered pins 516 and 616 have been used, a continuous layer 600 of sheet material forms a sealed end 600 over the hollow projection 104 (shown in FIG. 6), which is air-tight. The sealed end 600 may have an uneven surface resulting from the shearing process. If a smooth surface is desired, the uneven surface may be smoothed by placing a support pin 718 under the sealed end 600 and punching a flat punch pin 716 over the sealed end 600 to compress the sealed end 600 into a desired shape (shown in FIG. 7).

FIG. 8 shows a side cross-sectional view of a blind hole formed in a sheet material 100 according to the above description. The sheet material 100 as shown has a thickness of D1. The blind hole projects from a bottom surface of the sheet material 100 and has a depth D2, where D2 is greater than D1, and an internal diameter D3. The recessed segment 102 is formed in a top surface of the sheet material 100 and has an internal diameter D4, where D4 is greater than D3. As illustrated in FIG. 8, the recessed segment 102 is integral with the sealed end 600 of the blind hole.

An advantage of the present invention is that the depth D2 of the blind hole can be greater than the thickness D1 of the sheet material 100. Further, by adjusting the internal diameter of the recessed segment D4 and the internal diameter D3 of the blind hole, a greater depth D2 of the blind hole can be achieved even though the thickness D1 of the sheet material 100 is unchanged. In addition, the blind hole formed in the present invention is air-tight, which is particularly important in applications where the leakage of air must be prevented.

The above-described method of forming blind holes is suitable for use in casing for hard disk drives, where PCBs and motors are mounted to the casing. FIG. 8 further illustrates a PCB board 802 and a mounting screw 804 for mounting the PCB board 802 to the sheet material 100, which may be processed to form part of a casing. Because the interior of a hard disk drive is very sensitive and may be easily damaged by particles in the air, the air-tight seal of the blind holes is extremely important to maintain system integrity.

As an illustration, the sheet material 100 in a hard disk drive may have a thickness of between about 1 to about 3 mm. The resulting blind hole may have an internal diameter of about 2.6 mm and a depth of about 4 to about 5 mm. The sheet material 100 of the present disclosure is typically made of a malleable material, which may comprise a metallic element, such as, aluminum, iron and steel.

Figure 9:
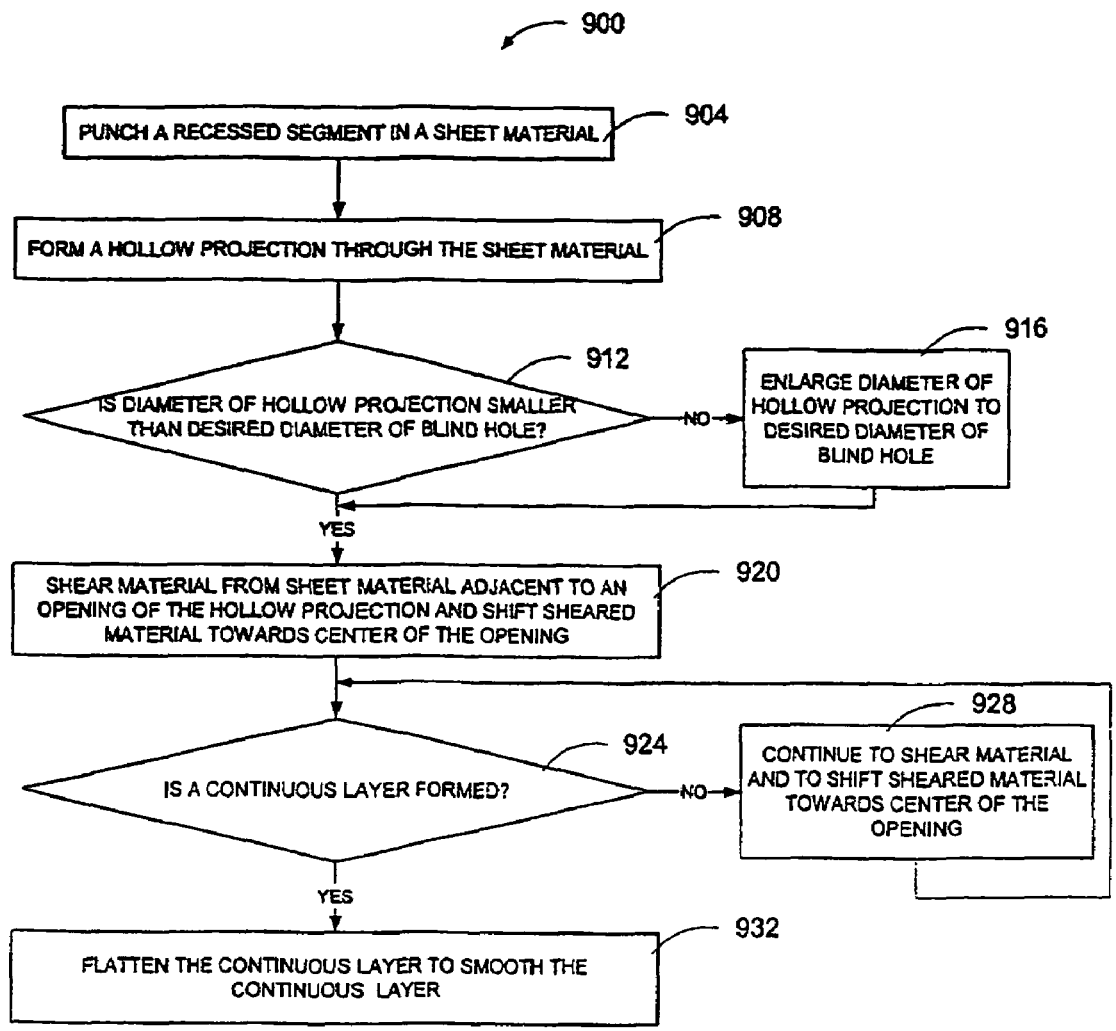
FIG. 9 illustrates a flow chart of forming a blind hole according to one embodiment of the present invention.

FIG. 9 illustrates a flow chart of a method 900 of forming a blind hole in a sheet material 100. Method 900 begins at a block 904 when a recessed segment is punched into the sheet material. Thereafter, a hollow projection is formed in the sheet material in a block 908. If the diameter of the hollow projection is not sufficiently large in a block 912, the hollow projection may be enlarged to the desired diameter by driving an enlarging pin into the hollow projection in a block 916. After the desired diameter of the blind hole is obtained, method 900 proceeds to shear material adjacent to an opening of the hollow projection and to shift the sheared material towards a center of the opening to form a continuous layer over the opening in a block 920. This is achieved by using a first tapered pin having a cutting edge for shearing the material, and having a tapered internal wall to shift the sheared material to the center of the opening. In a block 924, method 900 then determines whether a continuous layer has been formed over the opening. If the continuous layer has not been formed, additional tapered pin with progressively decreasing diameters may be used to continue the shearing process until a continuous layer forms a sealed end over the hollow projection in a block 928. Further processing may be needed to flatten or compress the sealed end into a desired shape in a block 932.

While the foregoing description refers to forming a blind hole with cylindrical configuration with circular cross-section, the described method is equally applicable to forming blind hole of other geometrical cross-sections, such as an ellipse, a rectangle and a polygon with a plurality of sides.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A method of forming a blind hole in a sheet of malleable material, comprising:
   punching a hollow projection through the sheet of malleable material, and
   then shearing a layer of material on one side of the sheet of malleable material to form a sealed end over an opening of the hollow projection to form the blind hole.

2. The method as recited in claim 1, further comprising enlarging the hollow projection to a predetermined diameter.

3. The method as recited in claim 1, wherein the layer of material is adjacent to the hollow projection.

4. The method as recited in claim 3, wherein the layer of material is sheared with a first pin having a cutting edge and a tapered internal wall, wherein the tapered internal wall is to shear the layer of material towards a center of the opening.

5. The method as recited in claim 4, wherein the layer of material is sheared with a second pin having a cutting edge and a tapered internal wall, wherein a diameter of the second pin is less than a diameter of the first pin.

6. The method as recited in claim 5, further comprising flattening a surface of the sealed end by punching a flat pin over the sealed end.

7. The method as recited in claim 1, wherein a depth of the blind hole is greater than a thickness of the sheet material.

* * * * *